United States Patent [19]

Dunham

[11] Patent Number: 4,536,710
[45] Date of Patent: Aug. 20, 1985

[54] MAGNETIC DETECTOR INSTRUMENT WITH BOARD-MOUNTED SENSOR ASSEMBLY

[75] Inventor: Warren D. Dunham, McLean, Va.

[73] Assignee: Schonstedt Instrument Company, Reston, Va.

[21] Appl. No.: 406,887

[22] Filed: Aug. 10, 1982

[51] Int. Cl.³ .................. G01R 33/02; H05K 7/08; H01F 15/02
[52] U.S. Cl. ............................ 324/244; 324/253; 324/262; 336/65; 361/400
[58] Field of Search ............... 324/244, 253, 260, 262, 324/326–329; 336/65, 66, 67, 199–200, 205, 206; 361/399–401

[56] References Cited

U.S. PATENT DOCUMENTS

| | | | |
|---|---|---|---|
| 3,555,464 | 11/1971 | Maeda et al. | 336/65 |
| 3,961,245 | 1/1976 | Schonstedt | 324/43 |
| 4,052,686 | 10/1977 | Schmitz | 336/65 |
| 4,110,689 | 8/1978 | Schonstedt | 324/254 |

Primary Examiner—Gerard R. Strecker
Assistant Examiner—Walter E. Snow
Attorney, Agent, or Firm—Shapiro and Shapiro

[57] ABSTRACT

A magnetic detector instrument includes an elongate circuit board and a magnetic sensor assembly which slides into a slot in one end of the board with edge portions of the board defining the slot being received in opposed elongate grooves formed in the sensor assembly. Also, a fitting for retaining the board while it is rotated in order to set the alignment of the sensor core includes elongate brackets with opposed grooves into which the circuit board slides.

6 Claims, 4 Drawing Figures

MAGNETIC DETECTOR INSTRUMENT WITH BOARD-MOUNTED SENSOR ASSEMBLY

BACKGROUND OF THE INVENTION

This invention relates to magnetic detector instruments, e.g., magnetometers, gradiometers and the like, which may include one or more magnetic sensors of the saturable core (fluxgate) type.

Magnetic sensors of the fluxgate type generally comprise a magnetic core and separate excitation and signal windings. The signal winding may, for example, be disposed on a tubular bobbin or the like, with the core and excitation conductor disposed interiorly of the bobbin.

With instruments using a single sensor, and also with instruments using multiple sensors, the precise axial alignment of the sensor core or cores is critical. For example, in a single-sensor, vector-type magnetometer where the sensor is generally contained in an elongate housing, the core axis should be aligned with the longitudinal axis of the housing. Also, in gradiometers, for example, using a pair of sensors with their excitation conductors connected in series, it is desirable for the core axes to be aligned substantially coaxially or in parallel. (See, for example, assignee's earlier U.S. Pat. Nos. 4,110,689 and 3,961,245.)

Generally, in magnetic detector instruments as described, if the core axis (or axes) is (or are) properly aligned, a uniform output signal will be produced when the instrument is rotated in a uniform magnetic field about the longitudinal axis of its housing. Accordingly, one known method of testing the alignment is to rotate the instrument about the longitudinal housing axis, and detect the output signal. This may then be adjusted, if required, by adjusting the alignment of the sensor core axis or axes.

The present invention is particularly concerned, in one of its aspects, with the manner of mounting a sensor on a circuit board or like support of a magnetic detector instrument so as to facilitate mounting and adjustment of the sensor, and, in another of its aspects, with a fitting for receiving the circuit board or support in an expeditious manner which facilitates rotation of the board about its longitudinal axis when setting the sensor alignment.

SUMMARY OF THE INVENTION

The invention provides, in one of its broader aspects, a magnetic detector instrument including a substantially planar sensor support, such as circuit board, a magnetic sensor assembly, which may be of generally cylindrical form, and means for mounting the sensor assembly on the support including a slot at one end of the support and opposed longitudinally extending grooves formed in the sensor assembly, the slot and grooves being relatively dimensioned and disposed for sliding of the sensor assembly into the slot with longitudinal slot-defining edge portions of the support being slideably received in the respective grooves. Adhesive may be applied between the grooves and said edge portions to secure the assembly on the support.

The sensor assembly may, for example, be of the type disclosed in U.S. Pat. No. 3,961,245 aforesaid, comprising an elongate tubular bobbin which carries the signal winding, an elongate magnetic core which fits inside the bobbin and which is provided with an excitation conductor, and at least one adjustable end cap for adjusting the relative alignment of the core axis and the bobbin. The bobbin may itself be carried in an external tubular sleeve provided with the elongate grooves, and may be secured in the sleeve with adhesive.

In another of its broader aspects, the invention provides a fitting in which an elongate planar sensor support of a magnetic detecting instrument, which includes at least one magnetic sensor assembly, may be mounted to enable the support to be rotated about its longitudinal axis for the purpose of setting the alignment of the sensor core, the fitting including means defining opposed longitudinal grooves for slideably receiving opposed longitudinal portions of the support in a manner whereby the support may be retained in the grooves, and means for mounting the fitting on a rotating mechanism providing an axis of rotation disposed in substantially parallel and coplanar alignment with the grooves and situated there-between.

Additional features of the invention will become apparent from the following description and claims read in conjunction with the accompanying drawings.

DESCRIPTION OF PREFERRED EMBODIMENT

Figure 1:
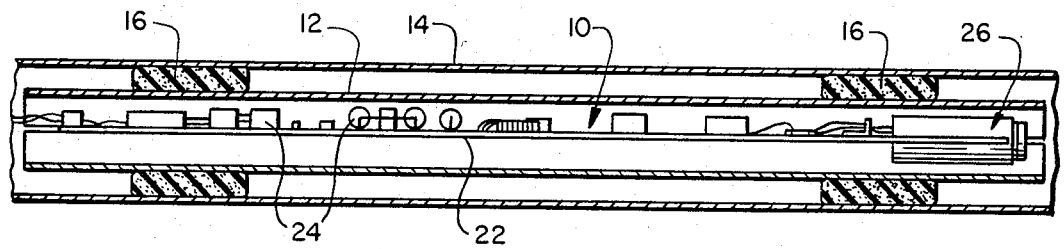
FIG. 1 is a longitudinal sectional view of part of a vector-type magnetometer in accordance with the invention.

The magnetometer illustrated in part in FIG. 1 comprises an elongate circuit board assembly 10 carried in an inner tube 12 which is itself mounted in an outer tube 14, for example, through the intermediary of foam mounting sleeves 16. Tubes 12 and 14 may, for example, be made of plastic, aluminum, or other non-magnetic material, and tube 12 may be split in two, lengthwise, with the two halves clamping against the circuit board assembly to hold it in place. Adhesive tape may be wound around tube 12 to hold its two halves together. The ends of tube 14 (not shown) may be provided with suitable end-caps or the like in known manner.

Figure 3:
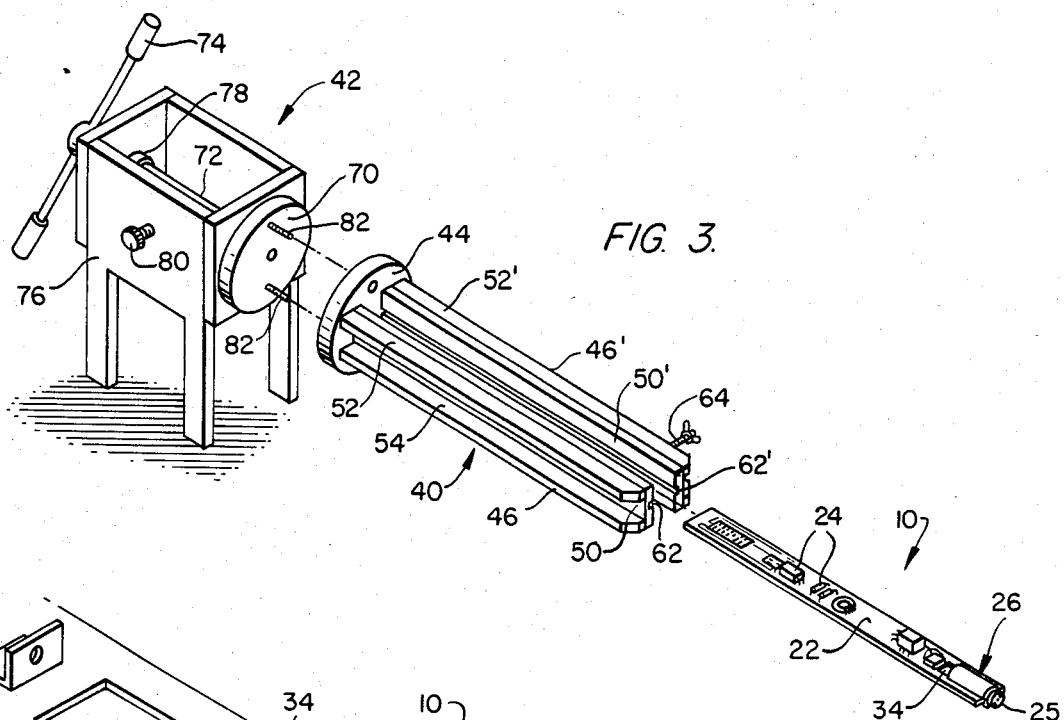
FIG. 3 is an exploded perspective view of apparatus in which the circuit board may be mounted for rotation about its longitudinal axis.
Figure 2:
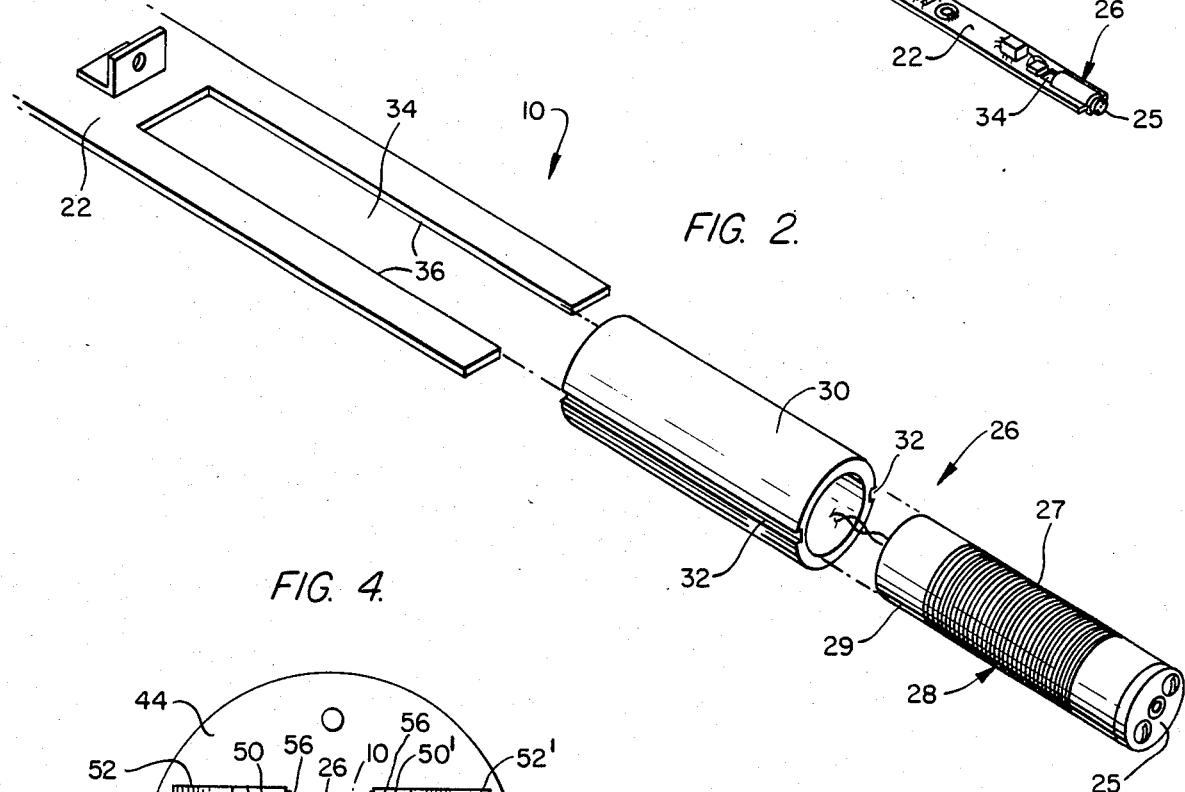
FIG. 2 is an exploded perspective view of one end of a circuit board assembly used in the magnetometer.

Circuit board assembly 10, see also FIGS. 2 and 3, includes the board itself (reference 22) which constitutes an elongate planar sensor support, electronic components, generally indicated at 24, mounted on the board, and a fluxgate-type magnetic sensor assembly 26, also mounted on the board. The present invention is concerned only with the manner in which the sensor assembly may be mounted on the circuit board, and with a fitting for setting the alignment of the respective axes of the sensor core and of the circuit board. Other details of the magnetometer, such as its electrical connections and constructional features, form no part of the present invention and will not, therefore, be described herein, since they may be of conventional form, well known in the art.

Sensor assembly 26 may, for example, comprise a known form of fluxgate sensor 28 (FIG. 2), carried in an outer tubular sleeve 30 of non-magnetic material, e.g., a phenolic or other plastic. Sensor 28 may, for example, be of the type disclosed in assignee's prior U.S. Pat. No.

3,961,245, incorporated herein by reference. This type of sensor includes an elongate tubular bobbin 29 having a signal winding 27, and an elongate magnetic core with an excitation conductor (not shown), the core fitting within the tubular bobbin. An adjustable end cap 25 may be provided for adjusting the alignment of the core axis relative to the bobbin.

The bobbin of sensor 28 may be a snug fit in sleeve 30, and it may, after appropriate adjustment of the sensor, as will be described, be cemented in the sleeve. Sleeve 30 has opposed longitudinally extending grooves 32, and the circuit board has a slot 34 at one end for receiving the sensor assembly. The length and width of the slot and the thickness of the board relative to the dimensions of tube 30 and grooves 32 are such that longitudinal edge portions 36 of the board which define the slot may be slidingly received in grooves 32 in order to mount the sensor assembly on the board. A suitable adhesive may be applied to the edge portions 36 of the board and to the grooves to secure the sensor assembly to the board. The signal winding and excitation conductor leads of the sensor extend out from the end of sleeve 30 for connection to the circuitry of the circuit board. The board may also be formed from a phenolic or other suitable non-magnetic material.

Figure 4:
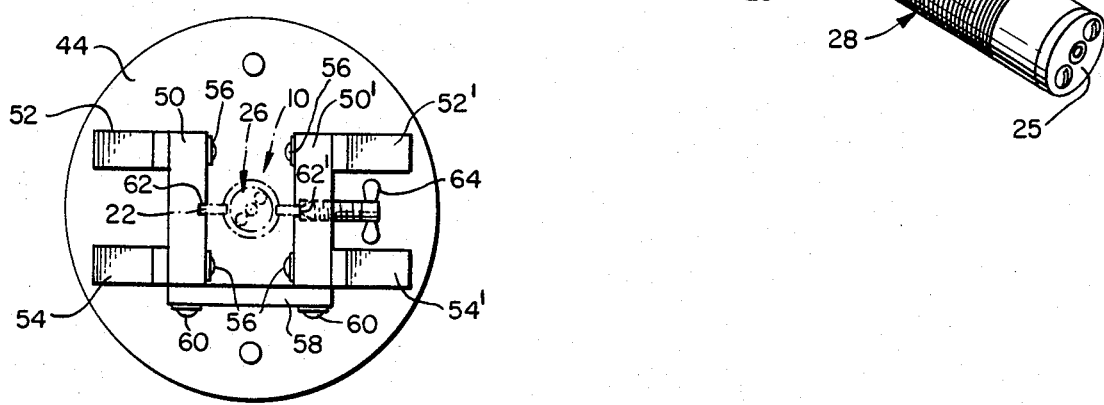
FIG. 4 is an end view of part of the apparatus shown in FIG. 3.

With sensor assembly 26 mounted on the circuit board, as described above, in order to set the alignment of the core axis relative to the longitudinal axis of the circuit board, it is expedient to rotate the entire circuit board assembly about its longitudinal axis while monitoring the sensor output and adjusting the alignment of the sensor core relative to the bobbin (as described in the above noted patent) if required. FIGS. 3 and 4 illustrate an apparatus for mounting and rotating the circuit board assembly for this purpose.

The apparatus illustrated in FIGS. 3 and 4 comprises a fitting 40 for receiving the circuit board and a rotating mechanism 42 to which the fitting may be releasably attached. Fitting 40 comprises a mounting plate 44 and elongate, channel-shaped mounting brackets 46, 46', the ends of which are attached to the mounting plate, e.g., by non-magnetic screws (not shown). Each of the brackets 46, 46' may comprise an elongate base member 50, 50' and elongate reinforcing members 52, 52' and 54, 54' secured to the base members by non-magnetic screws 56. The structure may be stabilized by a cross-brace 58 which may be attached to the respective base members by non-magnetic screws 60.

Base members 50, 50' are spaced apart a distance substantially corresponding to the width of circuit board 22, and the inner faces of the base members are formed with lengthwise grooves 62, 62' for slidingly receiving the opposite edges of the circuit board whereby the circuit board assembly can be mounted in the fitting. The grooves may be in coplanar alignment with the central axis of plate 44. Fitting 40 is made of suitable non-magnetic material, e.g., plate 44 may be aluminum, base members 50, 50' may be phenolic, or fiberglass, and reinforcing members 52, 52' may be phenolic, fiberglass or aluminum. A screw 64 may penetrate into one of the grooves 62, 62' for tightening down on the circuit board and holding it in place during rotating of the fitting.

Rotating mechanism 42 which is constructed generally of non-magnetic material, may include a mounting plate 70 similar and complementary to plate 44, a shaft 72 carrying plate 70, a handle 74 for manually rotating the shaft, and a suitable frame 76 carrying the shaft in suitable bearings 78. An adjusting screw 80 adapted to bear on shaft 72 may be provided for applying an adjustable degree of friction to the shaft.

Plates 44 and 70 may, for example, be attached together by screws 82, and the mating plate surfaces may be machined so as to be precisely perpendicular to the axis of shaft 72 and to grooves 62, 62'. The grooves are coplanar with the central axis of plate 44 and equally spaced on opposite sides thereof. The arrangement is intended to insure accurate rotation of the sensor assembly and board about the longitudinal board axis.

In use, with the circuit board assembly inserted into grooves 62, 62', the circuit board electronics may be connected to suitable control apparatus in known manner for testing the relative alignment of the sensor core and board axes. When the fitting 42 is rotated with shaft 72 in a uniform magnetic field, if a signal is emitted indicative of a misalignment, the alignment of the sensor core may be adjusted, e.g., by adjustment of the sensor end-cap as previously described. When suitable alignment is achieved, the end-cap may, for example, be cemented to the bobbin.

It will be apparent from the foregoing that the invention provides a simple and convenient means for mounting a magnetic sensor assembly on a circuit board or the like in magnetic detector apparatus, and also provides convenient apparatus for mounting a circuit board or like assembly for the purpose of testing sensor alignment.

While the invention has been specifically described with reference to detector apparatus using a single sensor assembly, it is equally applicable to multi-sensor instruments. Other modifications may also be made within the scope of the attached claims.

What is claimed is:

1. A magnetic detector instrument comprising a substantially planar elongate circuit board supporting electronic components of the instrument and constituting a sensor support, an elongate magnetic sensor assembly having a magnetic axis along its length, and means mounting the sensor assembly on the support including a slot having an open end at one end of the support and a pair of opposed longitudinally extending external grooves formed in the sensor assembly, said sensor assembly fitting longitudinally into said slot through its open end, with the magnetic axis along the length of said circuit board and with slot-defining edge portions of the support received in the respective grooves whereby the sensor assembly is retained in the slot.

2. An instrument as defined in claim 1 including adhesive between said edge portions and said grooves for securing the assembly on the support.

3. An instrument as defined in claim 1 wherein the sensor assembly includes a magnetic sensor and an outer sleeve receiving the sensor, with the grooves being formed in the outer sleeve.

4. An instrument as defined in claim 3 wherein the sensor includes a tubular bobbin provided with a signal winding, an elongate magnetic core received within the bobbin and provided with an excitation conductor, and means for adjusting the relative alignment of the core and the bobbin.

5. An instrument as defined in claim 1, further comprising housing means receiving said board therein and holding the same rigidly.

6. An instrument as defined in claim 5, wherein said housing means comprises a split tube having said board clamped between portions thereof longitudinally.

* * * * *